US007111111B2

(12) United States Patent
Neuman et al.

(10) Patent No.: US 7,111,111 B2
(45) Date of Patent: Sep. 19, 2006

(54) SCHEME FOR OPTIMAL SETTINGS FOR DDR INTERFACE

(75) Inventors: Darren Neuman, Palo Alto, CA (US); Sathish Kumar Radhakrishnan, Bangalore (IN); Jeffrey Fisher, Dublin, CA (US); Joshua Stults, Irvine, CA (US); Nitin Borle, Bangalore (IN); Kaushik Bhattacharya, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 426 days.

(21) Appl. No.: 10/716,066

(22) Filed: Nov. 18, 2003

(65) Prior Publication Data

US 2005/0010713 A1 Jan. 13, 2005

Related U.S. Application Data

(60) Provisional application No. 60/485,597, filed on Jul. 8, 2003.

(51) Int. Cl.
  *G06F 12/00* (2006.01)

(52) U.S. Cl. .................. 711/105; 711/167; 711/170
(58) Field of Classification Search .............. None
  See application file for complete search history.

(56) References Cited

U.S. PATENT DOCUMENTS 6,768,691 B1 *  7/2004  Kumazaki et al. .......... 365/198
2005/0010714 A1 *  1/2005  Kumar et al. .................. 711/1

* cited by examiner

*Primary Examiner*—Reginald G. Bragdon
*Assistant Examiner*—Daniel Ko
(74) *Attorney, Agent, or Firm*—McAndrews, Held & Malloy, Ltd.

(57) ABSTRACT

Methods of optimizing a plurality of numerically controlled delay lines (NCDLS) in a DDR memory controller are presented herein. In one embodiment, a method may comprise, for example, one or more of the following: acquiring a plurality of statistics, the plurality of statistics defining an operating region for the DDR memory controller; and calculating optimal values for the plurality of NCDLs, the optimal values calculated using the plurality of statistics.

32 Claims, 6 Drawing Sheets

DLL and NCDL Mechanism in DDR Memory Controller

DLL and NCDL Mechanism in DDR Memory Controller

CENTER ALIGNMENT OF DQS AND DATA SIGNALS

Plot of Passing Count Vs Gate NCDL

SCHEME FOR OPTIMAL SETTINGS FOR DDR INTERFACE

RELATED APPLICATIONS

This application makes reference to, claims priority to, and claims the benefit of U.S. Provisional Patent Application 60/485,597 filed on Jul. 8, 2003, entitled "Scheme for Optimal Settings for DDR Interface," the complete subject matter of which is hereby incorporated herein by reference, in its entirety.

FEDERALLY SPONSORED RESEARCH OR DEVELOPMENT

Not Applicable

MICROFICHE/COPYRIGHT REFERENCE

Not Applicable

BACKGROUND OF THE INVENTION

Signal timing is a critical aspect of high-speed digital circuit design. Reading data from memory and writing data to memory can be erroneous if control signals are not in sync with each other. In high frequency digital design, control signals can go out of sync due to different length of tracks they traverse on PCB, physical characteristics of the devices mounted on the board and changes in environment in which circuit is working.

Further limitations and disadvantages of conventional and traditional systems will become apparent to one of skill in the art through comparison of such systems with the inventions as set forth in the remainder of the present application with reference to the drawings.

BRIEF SUMMARY OF THE INVENTION

Aspects of the present invention may be found in, for example, methods of optimizing a plurality of numerically controlled delay lines (NCDLs) in a DDR memory controller. A method in accordance with the present invention may comprise, for example, one or more of the following: acquiring a plurality of statistics, the plurality of statistics defining an operating region for the DDR memory controller; and calculating optimal values for the plurality of NCDLs, the optimal values calculated using the plurality of statistics.

In another embodiment, there is an article of manufacture comprising a computer readable medium. The computer readable medium stores a plurality of instructions. Execution of the plurality of instructions causes acquiring a plurality of statistics, the plurality of statistics defining an operating region for a DDR memory controller; and calculating optimal values for a plurality of numerically controlled delay lines (NCDLs) in the DDR memory controller, the optimal values calculated using the plurality of statistics.

These and other advantages, aspects and novel features of the present invention, as well as details of an illustrated embodiment thereof, will be more fully understood from the following description and drawings.

DETAILED DESCRIPTION OF THE INVENTION

Figure 1A:
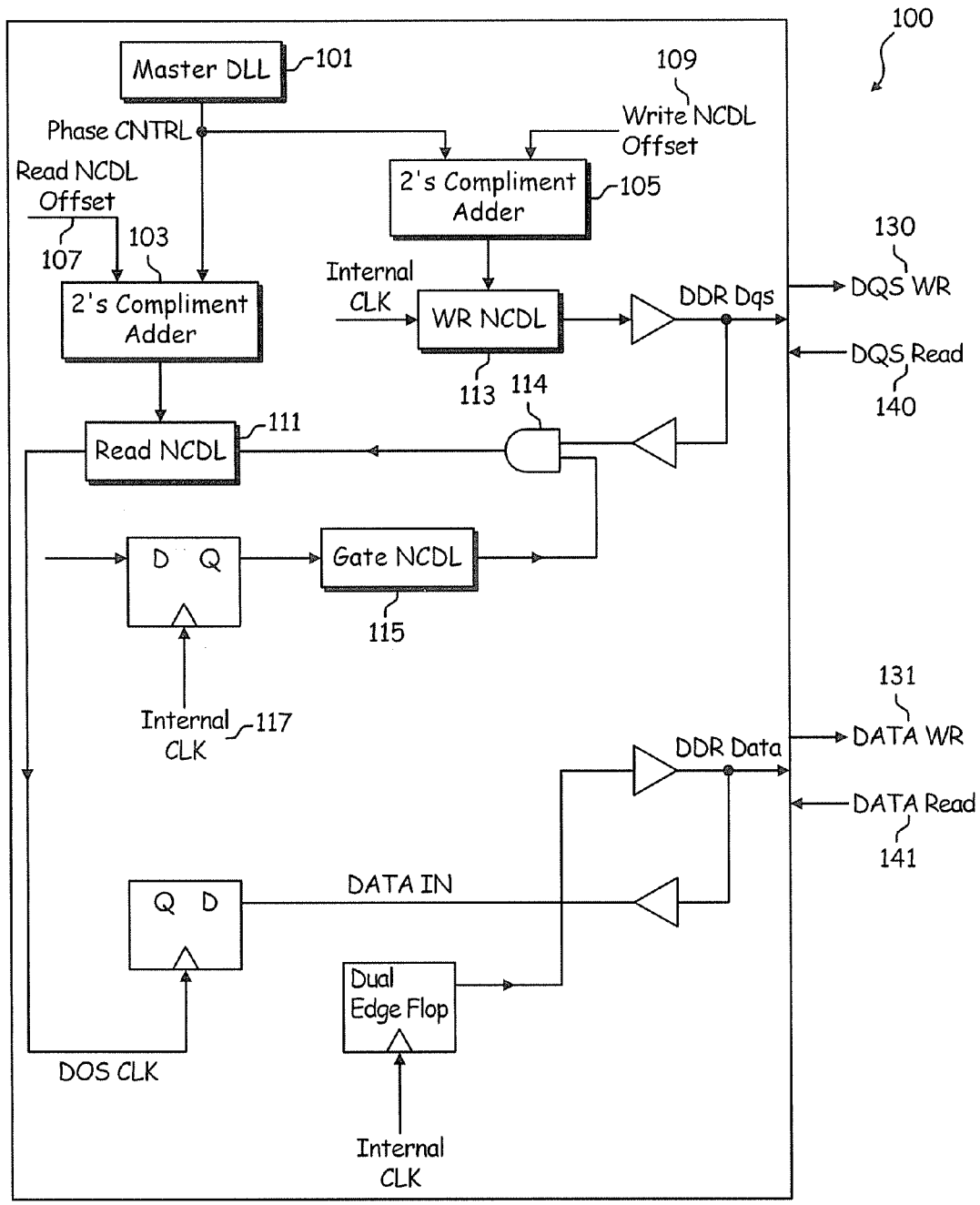
FIG. 1A is a block diagram of a DDR Memory Controller, in accordance with an embodiment of the present invention.

Referring now to FIG. 1A, there is illustrated a DDR memory controller in accordance with an embodiment of the present invention. The DDR memory controller 100 comprises a master delay locked loop (DLL) 101, a read numerically controlled delay line (NCDL) 111, a write NCDL 113, a gate logic 114, a gate NCDL 115, two's complimentary adders 103 and 105, a read NCDL offset 107, a write NCDL offset 109, and an internal clock 117.

A DDR-SDRAM (DDR device) is a Double Data Rate Synchronous Dynamic Random Access Memory, which receives and transfers data at both edges of the clock in order to achieve high bandwidth. In order to ensure that the data is received and transferred reliably, DDR defines a bidirectional signal called DQS (or a data strobe signal), and the timing of the data is specified with respect to the edges of this signal.

Figure 1B:
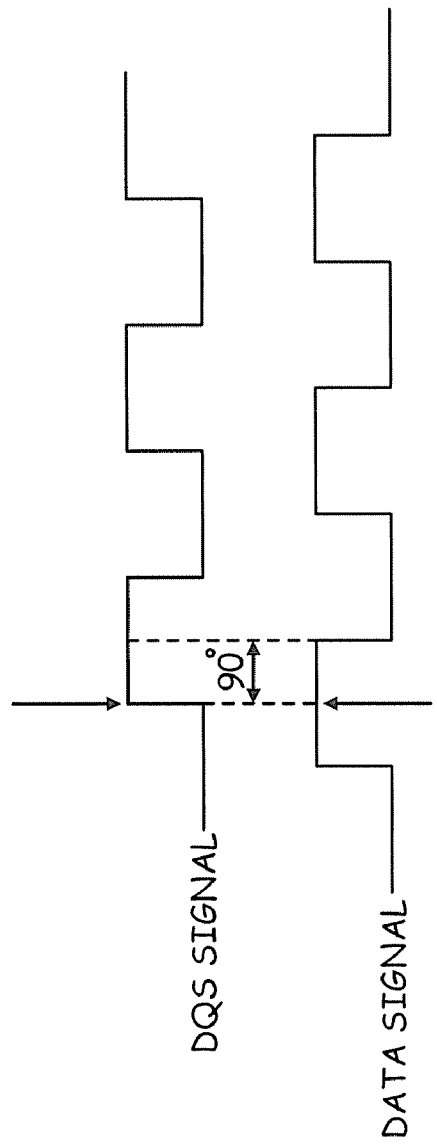
FIG. 1B is a signal plot of a center aligned DQS signal with respect to a data signal, in accordance with an embodiment of the present invention.

The DQS is center aligned with respect to data during a write operation to the DDR device. Referring now to FIG. 1B, there is illustrated a signal plot of a center aligned DQS signal with respect to a data signal. The DDR device outputs DQS that is edge aligned with respect to data during the read operation. The DDR controller 100 is an agent that interfaces with the DDR device and all the components on the board access the DDR device through the DDR controller 100. During a write operation, the DDR controller is expected to center align (90-degree phase shift) the DQS with respect to the data signal, as illustrated on FIG. 1B. DQS signal is tri-stated when there is no read or write operation. The noise can trigger a false read. Hence, during a read operation, the controller first validates the DQS by opening the gate signal. Referring again to FIG. 1A, the DQS read signal 140 is received with the incoming data read signal 141. The DQS read signal 140 is then validated by the controller 100 by opening the gate 114. The controller 100 then phase shifts the DQS read signal 140 by 90 degree to reliably register the incoming data. Since the incoming DQS 140 will not be in phase with the controller's internal clock 117, gate opening is achieved by delaying the internal clock generated gate signal with the use of the gate NCDL 115.

Figure 2:
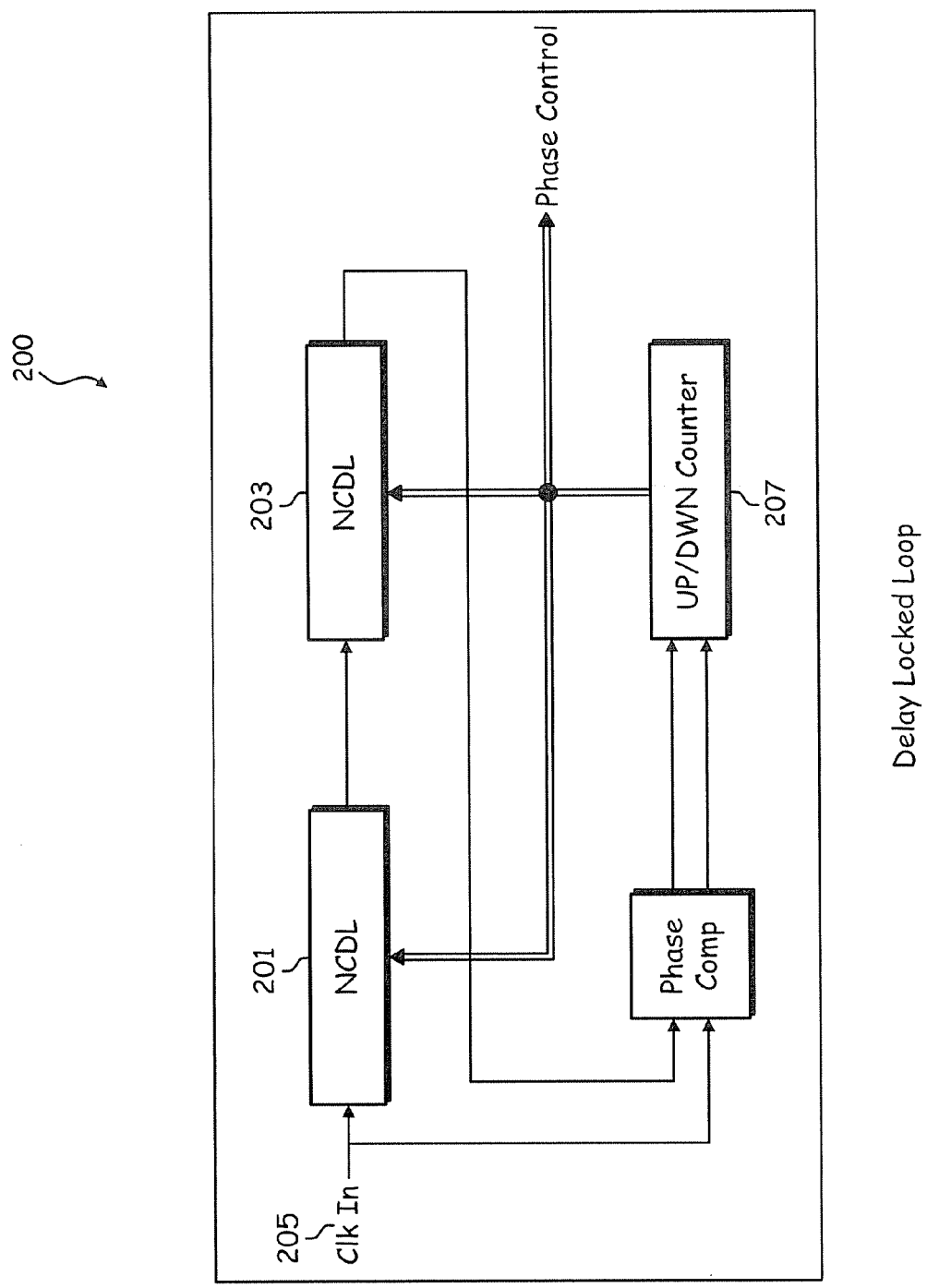
FIG. 2 is a blocked diagram of a delay locked loop, in accordance with an embodiment of the present invention.

A numerically controlled delay line (NCDL) is a piece of hardware that delays the signal passed through it. The amount of delay is proportional to a value set at the phase control input of the NCDL. DLL (Delay locked loop) is a piece of hardware that uses similar NCDLs to phase lock the input and output clock. Referring now to FIG. 2, there is illustrated a DLL, using two NCDLs, 201 and 203, to lock the output at 180 degree with respect to the input clock 205. Since the value of the up/down counter 207 is fed to both NCDL 201 and NCDL 203, and the DLL achieves a phase lock of 180 degrees, the counter 207 contains a numerical value that would give a 90 degrees phase shift between the input and the output of any other similar NCDL.

Referring again to FIG. 1A, the phase shift on the DQS signals 130 and 140 is achieved by using an NCDL, whose numerical input is generated by a DLL. This setup ensures that the phase shift obtained tracks Process-Voltage-Temperature (PVT) variation. However, because of board skews, the phase shift obtained from the DLL might not exactly produce a 90 degrees phase shift on the DQS path. An embodiment of the present invention allows for an offset of the numerical value produced by the DLL in order to achieve optimum setting for the DDR controller 100. It also allows for the gate opening 14 to be fixed at an optimal point allowing reliable operation across PVT variations.

The DDR controller 100 has three NCDLs—a gate NCDL 115, a read NCDL 111, and a write NCDL 113. The read NCDL 111 is used to phase shift the DQS read signal 140 with respect to the data read signal 141 when data is read from the DDR device. The write NCDL 113 is used to phase shift the DQS write signal 130 with respect to the data write signal 131 when data is written to the DDR device connected to the DDR controller 100. The gate NCDL 115 allows for an optimization of opening the gate logic 114 for the incoming DQS read signal 140 during a read operation.

The master DLL 101 outputs a number that, when programmed in an NCDL, would produce a 90-degree phase shift in the signal passing through it. Since similar NCDLs are being used as the read NCDL 111 and the write NCDL 113, the numerical value from the master DLL 101 produces the same 90-degree phase shift for the read NCDL 111 and the write NCDL 113. However, to compensate for the board skews, a programmable offset is added to the numerical output of the master DLL 101. The read and write NCDLs have separate programmable offset registers, providing a read NCDL offset value 107 and a write NCDL offset value 109. The output from the master DLL 101 and the two offset values, 107 and 109, are fed into compliment adders 103 and 105. The values that get programmed into the read NCDL 111 and the write NCDL 113 are the two's compliment additions of the DLL output value and the respective NCDL offsets 107 and 109. However, the gate NCDL 115, that is used to delay signal entering the gate logic 114, is programmed with an absolute value.

In accordance with an embodiment of the present invention, a software program tests all the possible combinations of the write NCDL offset 109, the read NCDL offset 107, and the gate NCDL 115 under stressful condition. The software then programs NCDL registers of the DDR memory controller 100 optimally, bringing sync relationship of 90-degree phase-shift between a DQS signal and a data signal. Even though offset is programmed into the read and write NCDLs, here onwards these programming values will be referred to as read NCDL and write NCDL. The range of NCDL values, for which the DDR memory controller 100 works reliably defines an operating region for the DDR memory controller. The optimal working point may then be calculated using the operating region.

Figure 3:
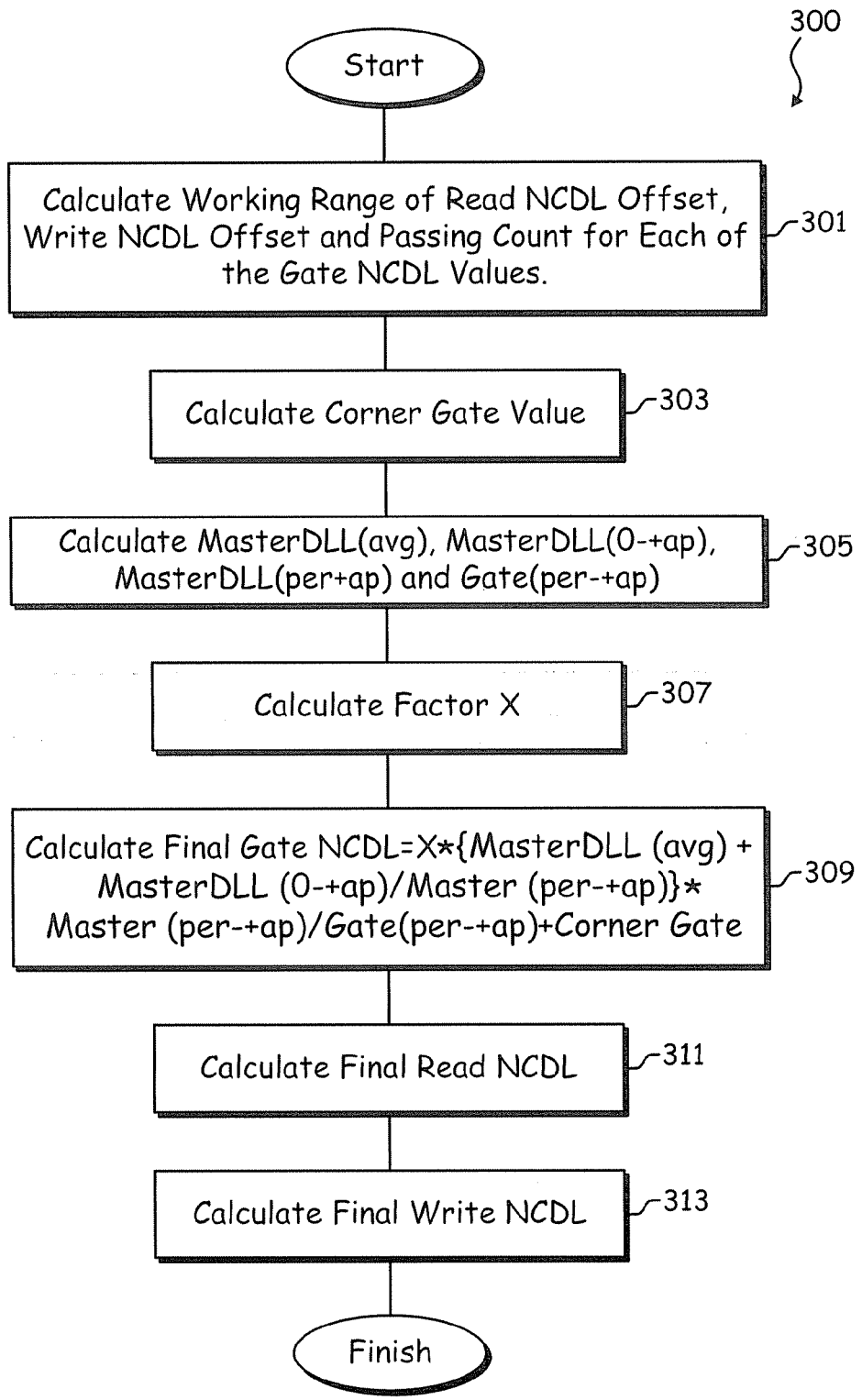
FIG. 3 is a flowchart illustrating an embodiment of a method for optimizing a plurality of numerically controlled delay lines (NCDLs) in a DDR memory controller, in accordance with an embodiment of the present invention.

Referring now to FIG. 3, there is illustrated a flow diagram for optimizing a plurality of numerically controlled delay lines (NCDLs) in a DDR memory controller, in accordance with an embodiment of the present invention. The method 300 comprises acquiring statistics that define the operating region of the DDR memory controller and finding out the optimal NCDL values for the read NCDL, the write NCDL, and the gate NCDL from the acquired statistics.

At 301, the necessary statistics are, acquired by calculating the working range of the read NCDL offset and the write NCDL offset, as well as a passing count for each of the gate NCDL values. Passing count is the number of working combinations of read and write NCDL values for a particular gate NCDL value. The stressful condition, under which these statistics are obtained is created by running SSO (Simultaneously Switched Outputs) test multiple times for each combination of the NCDL values. In the SSO test, all the lines in a data bus are switched simultaneously from 0 to 1, or from 1 to 0. This stresses the power supply resulting in more slanting edges and reduced data eye width. Each SSO test is preceded by one random pattern write and read back test. This is necessary to eliminate false passing of the SSO test—case in which write fails but read still passes due to correct write in the previous SSO test. For each of the NCDL combination, SSO test is run multiple times at different critical memory locations (e.g. different bank boundaries etc) throughout the available memory. This has the effect of reducing data eye width.

Figure 4:
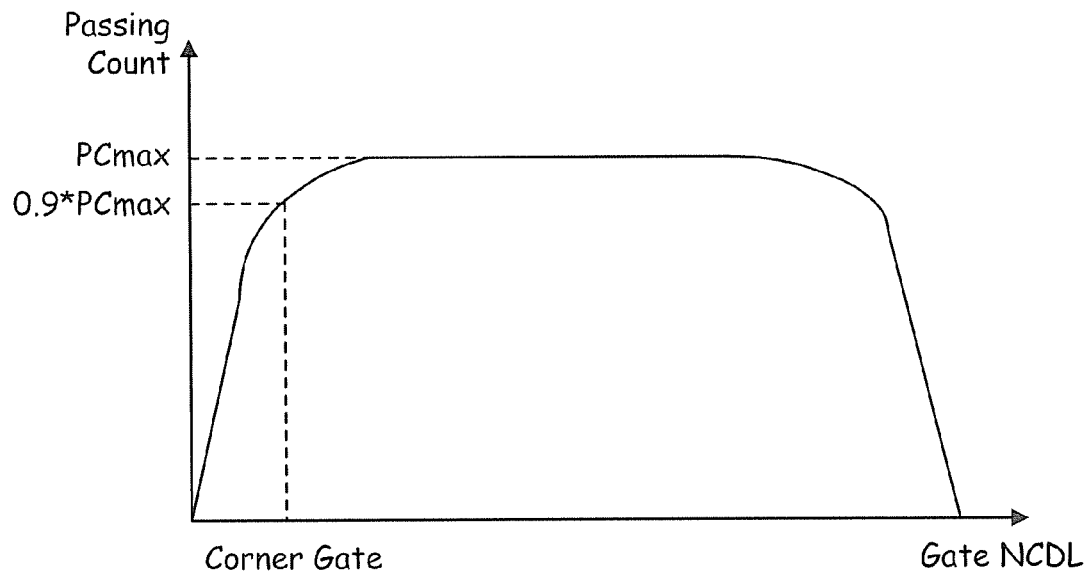
FIG. 4 is a plot of a passing count versus gate NCDL, in accordance with an embodiment of the present invention.

The statistics acquired during 301 are used to calculate the optimal setting for the DDR controller. First from the statistics, corner gate value is calculated during 303. Referring now to FIG. 4, there is illustrated a plot of passing count versus gate NCDL values. The corner gate value is defined as the gate value that has 90% of the maximum number of passing counts.

Referring again to FIG. 3, MasterDLL(avg), MasterDLL(0-tap), MasterDLL(per tap) and Gate(per tap) values are calculated during 305. The following formulas may be used for the calculations during 305:

$$\text{Master}DLL(\text{avg})=\text{Average value of high and low master } DLL \text{ value}$$

$$\text{Master}DLL(0\text{-tap})=\text{Amount of 0-tap delay in picosecond}$$

$$\text{Master}DLL(\text{per-tap})=\text{Per tap delay of master } DLL \text{ in picosecond}$$

$$\text{Gate}(\text{per-tap})=\text{Per tap delay of Gate } NCDL \text{ in picosecond}$$

At 307, a factor value X is calculated, in accordance with the following formula:

$$X=\text{Factor defined as } ((\text{clk\_period}/4)-\text{tdqsck})/(\text{clk\_period}/4), \text{ where tdqsck=the clock to } DQS \text{ skew as defined by the DDR datasheet.}$$

This factor value gives the effective 90-degree delay tap value of the gate NCDL.

At 309, the final gate NCDL value is calculated, which represents the optimum value for the gate NCDL. The following formula is utilized:

$$\text{Final Gate } NCDL=X*\{\text{Master}DLL(\text{avg})+\text{Master}DLL(0\text{-tap})/\text{Master}(\text{per-tap})\}*\text{Master (per-tap)}/\text{Gate (per-tap)}+\text{GateCorner}$$

The optimum value for the read NCDL, the Final Read NCDL, is calculated at 311, by averaging all Read NCDL values in the Read NCDL range for the Final Gate NCDL value obtained during 309.

The optimum value for the write NCDL, the Final Write NCDL, is calculated during 313, by averaging all Write NCDL values in Write NCDL range for the Final Gate NCDL value obtained during 309.

Figure 5:
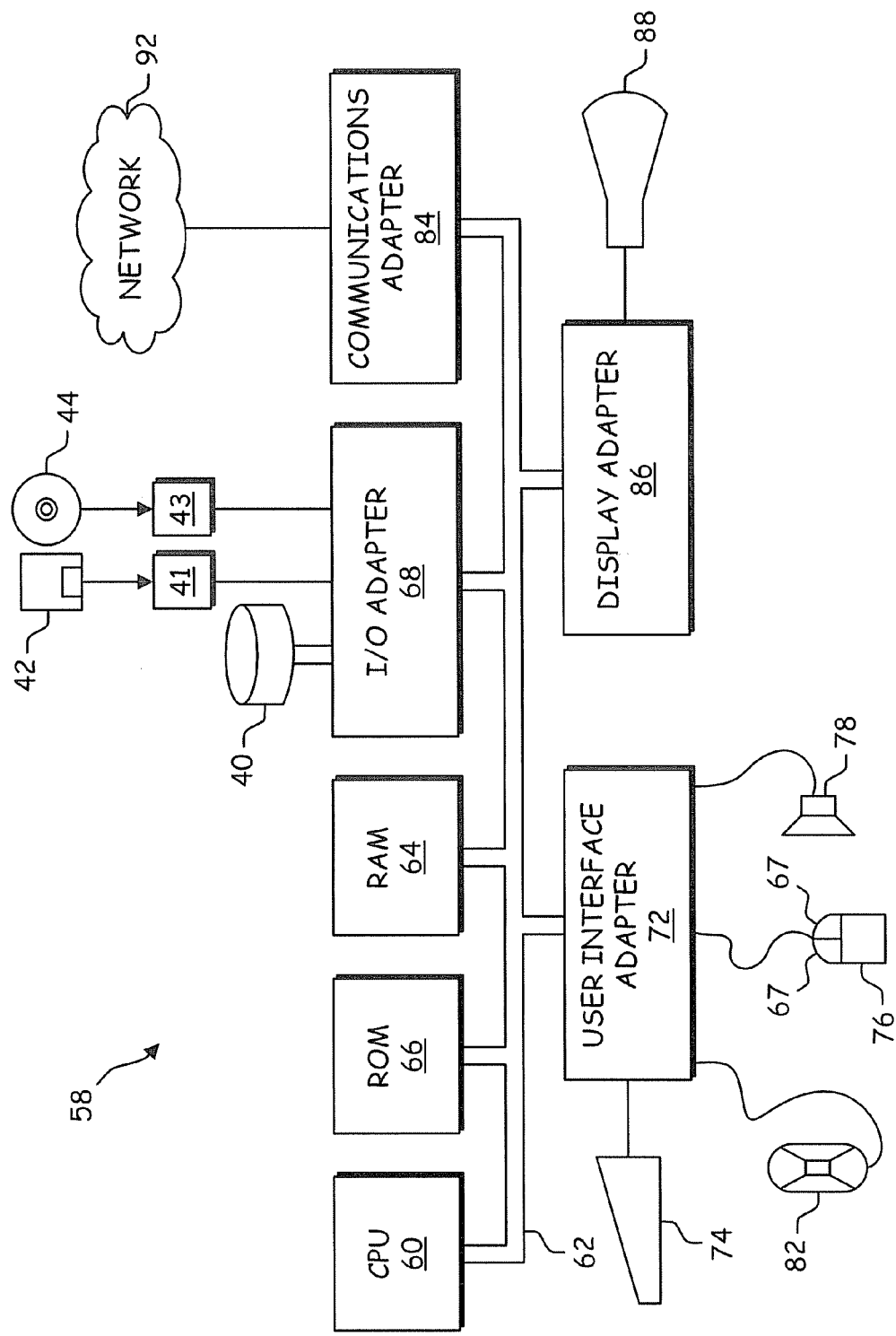
FIG. 5 is an exemplary hardware environment, wherein the present invention may be practiced.

If corner gate value is not found in the statistics, then the statistics may be divided in two parts. One part will correspond to gate values having passing counts more than 90% of the maximum number of passing counts. The second part will correspond to gate values having passing counts less than 90% of the maximum number of passing counts. The second part may then be discarded and optimum NCDL values may be calculated from the first part by averaging, as follows:

> Final Gate NCDL=Average of all Gate NCDL values
>
> Final Read NCDL=Average of all Read NCDL values in all Read NCDL ranges for all Gate NCDLs
>
> Final Write NCDL=Average of all Write NCDL values in all Write NCDL ranges for all Gate NCDLs Referring now to FIG. 5, a representative hardware environment for a computer system 58 for practicing the present invention is depicted. A CPU 60 is interconnected via system bus 62 to random access memory (RAM) 64, read only memory (ROM) 66, an input/output (I/O) adapter 68, a user interface adapter 72, a communications adapter 84, and a display adapter 86. The input/output (I/O) adapter 68 connects peripheral devices such as hard disc drives 40, floppy disc drives 41 for reading removable floppy discs 42, and optical disc drives 43 for reading removable optical disc 44 (such as a compact disc or a digital versatile disc) to the bus 62. The user interface adapter 72 connects devices such as a keyboard 74, a mouse 76 having a plurality of buttons 67, a speaker 78, a microphone 82, and/or other user interfaces devices such as a touch screen device (not shown) to the bus 62. The communications adapter 84 connects the computer system to a data processing network 92. The display adapter 86 connects a monitor 88 to the bus 62.

An embodiment of the present invention can be implemented as a file resident in the random access memory 64 of one or more computer systems 58 configured generally as described in FIG. 5. Until required by the computer system 58, the file may be stored in another computer readable memory, for example in a hard disc drive 40, or in removable memory such as an optical disc 44 for eventual use in an optical disc drive 43, or a floppy disc 42 for eventual use in a floppy disc drive 41. The file can contain a plurality of instructions executable by the computer system, causing the computer system to perform various tasks, such effectuating the flow chart described in FIG. 3.

One skilled in the art would appreciate that the physical storage of the sets of instructions physically changes the medium upon which it is stored electrically, magnetically, or chemically so that the medium carries computer readable information.

While the invention has been described with reference to certain embodiments, it will be understood by those skilled in the art that various changes may be made and equivalents may be substituted without departing from the scope of the invention. In addition, many modifications may be made to adapt. particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A method for optimizing a plurality of numerically controlled delay lines (NCDLs) in a double data rate (DDR) memory controller, the method comprising:

(a) acquiring a plurality of statistics, the plurality of statistics defining an operating region for the DDR memory controller; and (b) calculating optimal values for the plurality of NCDLs, the optimal values calculated using the plurality of statistics.

2. The method of claim 1, wherein the plurality of NCDLs comprise at least one of a write NCDL, a read NCDL, and a gate NCDL.

3. The method of claim 2, wherein the plurality of statistics comprise a write NCDL offset, the write NCDL offset complimenting a delay locked loop output value and enabling the write NCDL to phase shift a data strobe write signal with respect to an outgoing data signal.

4. The method of claim 2, wherein the plurality of statistics comprise a read NCDL offset, the read NCDL offset complimenting a delay locked loop output value and enabling the read NCDL to phase shift a data strobe read signal with respect to an incoming data signal.

5. The method of claim 2, wherein the gate NCDL enables phase shifting a data strobe read signal with respect to the DDR memory controller's internal clock signal.

6. The method of claim 2, wherein the plurality of statistics comprise a passing count value, the passing count value associated with a number of working combinations of read NCDL values and write NCDL values for a given gate NCDL value.

7. The method of claim 1, wherein the plurality of statistics is acquired by running a simultaneously switched outputs test on the DDR memory controller.

8. The method of claim 7, wherein the simultaneously switched outputs test is performed at least once for each combination of NCDL values for the plurality of NCDLs.

9. The method of claim 1, wherein the optimal values comprise a final gate NCDL value.

10. The method of claim 9, wherein the final gate NCDL value is a function of a corner gate value, the corner gate value associated with a passing count value.

11. The method of claim 9, wherein the final gate NCDL value is a function of a delay locked loop output value.

12. The method of claim 1, wherein the optimal values comprise a final read NCDL value.

13. The method of claim 12, wherein the final read NCDL value is a function of a final gate NCDL value.

14. The method of claim 12, wherein the final read NCDL value is a function of a plurality of read NCDL values.

15. The method of claim 1, wherein the optimal values comprise a final write NCDL value.

16. The method of claim 15, wherein the final write NCDL value is a function of a plurality of write NCDL values.

17. A computer readable media storing a plurality of instructions, wherein execution of the plurality of instructions causes:

(a) acquiring a plurality of statistics, the plurality of statistics defining an operating region for a double data rate (DDR) memory controller; and (b) calculating optimal values for a plurality of numerically controlled delay lines (NCDLs) in the DDR memory controller, the optimal values calculated using the plurality of statistics.

18. The computer readable media of claim 17, wherein the plurality of NCDLs comprise at least one of a write NCDL, a read NCDL, and a gate NCDL.

19. The computer readable media of claim 18, wherein the plurality of statistics comprise a write NCDL offset, the write NCDL offset complimenting a delay locked loop output value and enabling the write NCDL to phase shift a data strobe write signal with respect to an outgoing data signal.

20. The computer readable media of claim 18, wherein the plurality of statistics comprise a read NCDL offset, the read NCDL offset complimenting a delay locked loop output value and enabling the read NCDL to phase shift a data strobe read signal with respect to an incoming data signal.

21. The computer readable media of claim 18, wherein the gate NCDL enables phase shifting of the internal clock generated gate signal with respect to the DDR device data strobe signal (DQS), so as to enable the incoming DQS for read data capture.

22. The computer readable media of claim 18, wherein the plurality of statistics comprise a passing count value, the passing count value associated with a number of working combinations of read NCDL values and write NCDL values for a given gate NCDL value.

23. The computer readable media of claim 17, wherein the plurality of statistics is acquired by running a simultaneously switched outputs test on the DDR memory controller.

24. The computer readable media of claim 23, wherein the simultaneously switched outputs test is performed at least once for each combination of NCDL values for the plurality of NCDLs.

25. The computer readable media of claim 17, wherein the optimal values comprise a final gate NCDL value.

26. The computer readable media of claim 25, wherein the final gate NCDL value is a function of a corner gate value, the corner gate value associated with a passing count value.

27. The computer readable media of claim 25, wherein the final gate NCDL value is a function of a delay locked loop output value.

28. The computer readable media of claim 17, wherein the optimal values comprise a final read NCDL value.

29. The computer readable media of claim 28, wherein the final read NCDL value is a function of a final gate NCDL value.

30. The computer readable media of claim 28, wherein the final read NCDL value is a function of a plurality of read NCDL values.

31. The computer readable media of claim 17, wherein the optimal values comprise a final write NCDL value.

32. The computer readable media of claim 31, wherein the final write NCDL value is a function of a plurality of write NCDL values.

* * * * *